US009613813B2

(12) United States Patent
Sherman et al.

(10) Patent No.: US 9,613,813 B2
(45) Date of Patent: Apr. 4, 2017

(54) METHOD FOR IMPROVING CRITICAL DIMENSION VARIABILITY BY IMPLANTING ARGON OR SILICON IONS INTO A PATTERNED MASK

(71) Applicant: Varian Semiconductor Equipment Associates, Inc., Gloucester, MA (US)

(72) Inventors: Steven Robert Sherman, Newton, MA (US); Todd Henry, Boxford, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/925,438

(22) Filed: Oct. 28, 2015

(65) Prior Publication Data

US 2016/0133467 A1 May 12, 2016

Related U.S. Application Data

(60) Provisional application No. 62/076,085, filed on Nov. 6, 2014.

(51) Int. Cl.
| | | |
|---|---|---|
| *H01L 21/266* | (2006.01) | |
| *H01L 21/306* | (2006.01) | |
| *G03F 7/20* | (2006.01) | |
| *H01L 21/027* | (2006.01) | |
| *H01L 21/66* | (2006.01) | |

(52) U.S. Cl.
CPC ........ *H01L 21/266* (2013.01); *G03F 7/70533* (2013.01); *G03F 7/70625* (2013.01); *H01L 21/0273* (2013.01); *H01L 21/30604* (2013.01); *H01L 22/20* (2013.01); *H01L 22/12* (2013.01)

(58) Field of Classification Search
CPC .. H01L 21/266; H01L 21/12; H01L 21/30604
See application file for complete search history.

(56) References Cited

U.S. PATENT DOCUMENTS

| | | | |
|---|---|---|---|
| 6,200,903 B1* | 3/2001 | Oh | ...... H01L 21/0274 216/62 |
| 6,232,048 B1* | 5/2001 | Buynoski | .................. G03F 7/40 257/E21.027 |
| 7,955,760 B2* | 6/2011 | Ha | ............................ G03F 1/74 430/311 |
| 2003/0222345 A1* | 12/2003 | Kenyon | .................... G03F 7/40 257/751 |
| 2006/0043536 A1* | 3/2006 | Co | ........................... G03F 7/40 257/632 |
| 2011/0159670 A1* | 6/2011 | Wang | ........................ G03F 7/42 438/514 |
| 2014/0272728 A1* | 9/2014 | Sinclair | .................... G03F 7/00 430/327 |

* cited by examiner

*Primary Examiner* — Michael Jung

(57) ABSTRACT

Methods of processing a workpiece are disclosed. Variability of the critical dimension of semiconductor structures may be affected by the critical dimension of the patterned mask. Ions may be implanted into the patterned mask to change the critical dimension. The ions may be implanted in accordance with an ion implant map, which determines an appropriate dose, energy and type based on the measured critical dimension of the patterned mask at a plurality of locations.

13 Claims, 6 Drawing Sheets

METHOD FOR IMPROVING CRITICAL DIMENSION VARIABILITY BY IMPLANTING ARGON OR SILICON IONS INTO A PATTERNED MASK

This application claims priority of U.S. Provisional Patent Application 62/076,085, filed Nov. 6, 2014, the disclosure of which is incorporated herein by reference in its entirety.

FIELD

Embodiments of the present disclosure relate to methods for improving the variability of the critical dimension of features on a semiconductor workpiece.

BACKGROUND

The fabrication of a semiconductor device involves a plurality of discrete and complex processes. One such process is a lithography process, where a substance, such as a photoresist, is applied to a surface of the workpiece. Subsequently, the photoresist is exposed to a pattern of light or other electromagnetic energy. In some embodiments, a mask is disposed between a light source and the workpiece. The exposure to light causes a chemical change that allows some of the photoresist to be removed by a special solution, referred to as a developer. Positive photoresist, the most common type, becomes soluble in the developer when exposed; with negative photoresist, unexposed regions are soluble in the developer. In either case, the remaining photoresist serves as a pattern for subsequent processes, such as etch processes.

The dimension of a feature in a photoresist pattern may be referred to as a critical dimension, also referred to as CD. For example, assume a pattern of lines, where each line of photoresist is surrounded by abutting regions, or spaces, where the photoresist has been removed. The width of a line is referred to as the critical dimension of the photoresist. Further, the distance between a given edge of two adjacent lines of photoresist, which is the width of the line plus the width of the space, may be referred to as the pitch.

Transistor performance is sensitive to the critical dimension of various device components, such as gate length, fin width (in the case of finFETs), shallows trench isolation size, contact dimension, metal line width and others. A critical dimension may be defined as the dimension of a feature whose size affects device performance. Variation of this critical dimension across a workpiece is problematic because the device will not operate as designed if the critical dimension of these features is not within design specifications. CD variation may be caused by many factors, such as etch non-uniformity, material non-uniformity, and workpiece topology. As semiconductor manufacturing technology advances, lithography and other processes are pushed close to the capability limits, it becomes increasingly difficult to reduce the variation in the critical dimension. For example, for lithography patterns having a CD of less than 30 nm, variability of 1-2 nm may be significant.

Therefore, it would be beneficial if there were a method of controlling the variability of the critical dimension in a lithography process. Further, it would be beneficial if this method improved the variability of the critical dimension of etched features on the workpiece.

SUMMARY

Methods of processing a workpiece are disclosed. Variability of the critical dimension of semiconductor structures may be affected by the critical dimension of the patterned mask. Ions may be implanted into the patterned mask to change the critical dimension. The ions may be implanted in accordance with an ion implant map, which determines an appropriate dose, energy and type based on the measured critical dimension of the patterned mask at a plurality of locations.

According to one embodiment, a method of processing a workpiece is disclosed. The method comprises applying a patterned mask to a surface of the workpiece; measuring a dimension of a mask feature at a plurality of locations on the workpiece; implanting ions into the patterned mask in an ion implant pattern based on the dimension of the mask feature measured at the plurality of locations; etching the workpiece after the implanting; and removing the patterned mask after the etching. In certain embodiments, the ion implant pattern is determined to reduce variability of a critical dimension of the patterned mask at the plurality of locations. In certain embodiments, the ion implant pattern is determined to reduce variability of a critical dimension of etched features in the workpiece.

According to a second embodiment, a method of processing a workpiece is disclosed. The method comprises applying a patterned mask to the workpiece; implanting ions into the patterned mask, where the ions are implanted based on an ion implant pattern calculated to reduce variability of a critical dimension of the workpiece; and processing the workpiece after the implanting. In some further embodiments, the ion implant pattern is calculated based on measurements of critical dimensions performed on other workpieces.

According to a third embodiment, a method of processing a workpiece is disclosed. The method comprises implanting ions into the workpiece, where the ions are implanted based on an ion implant pattern calculated to reduce variability of a critical dimension of the workpiece; applying a patterned mask to the workpiece after the implanting; and processing the workpiece after the applying. In some further embodiments, the ion implant pattern is calculated based on measurements of critical dimensions performed on other workpieces.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
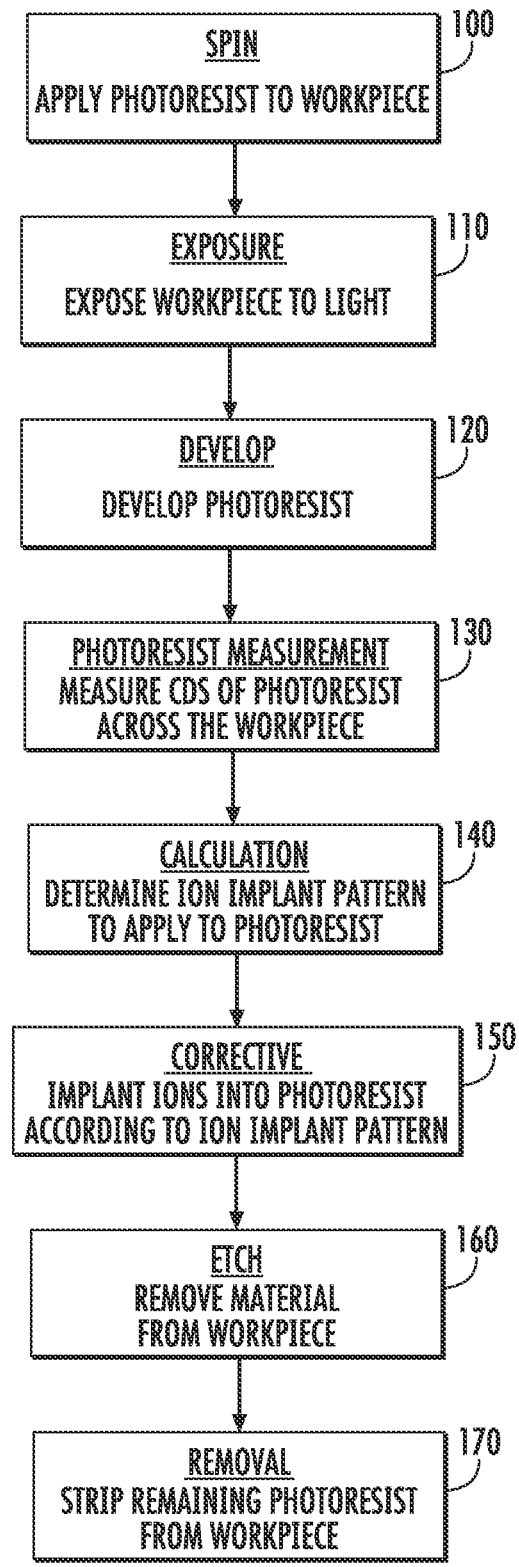
FIG. 1 is a first sequence to improve the variability of the critical dimension of a workpiece.

As described above, one aspect of semiconductor device fabrication is the lithography process. Photoresist may be applied to a portion or to the entirety of a surface of a workpiece. In some cases, this is performed by rotating or spinning the workpiece, so that the photoresist gets spread across the entirety of the workpiece in a uniform layer. Of course, achieving a perfectly uniform photoresist layer is difficult, and non-uniformities in thickness may result. After the photoresist has been spun onto the workpiece, the workpiece with the photoresist is exposed to light or other electromagnetic energy to make a pattern. In some embodiments, a shadow mask is interposed between the light source and the workpiece. The shadow mask comprises a pattern of apertures through which the light may pass and reach the workpiece. In the regions of the shadow mask without apertures, the light is blocked and does not reach the workpiece. Thus, the workpiece is exposed to a light pattern having the pattern of the shadow mask. In the case of negative photoresist, the portion of the photoresist that is exposed to the light is not soluble in a developer while the unexposed photoresist becomes soluble. In the case of a positive photoresist, the portion of the photoresist that is exposed to the light becomes soluble in a developer while the unexposed photoresist is not soluble.

In either embodiment, the develop process typically involves subjecting the photoresist to a chemical, which washes away the soluble photoresist to create the desired photoresist pattern.

The resulting workpiece has photoresist disposed in the desired pattern. For typical semiconductor integrated circuit manufacturing, many identical integrated circuits, or "chips," are patterned across the workpiece, typically a silicon wafer. Therefore, the desired photoresist pattern is repeated many times across the workpiece. However, as described earlier, the critical dimension of a photoresist feature may not be constant as it is repeated across the workpiece. For example, non-uniform workpiece topography may cause focus variation during light exposure. Any non-uniformity of the CD of the photoresist will likely result in non-uniformity of the CD of etched features in the processed workpiece.

Therefore, in one embodiment, after the develop process, the critical dimension of the photoresist is measured across the workpiece. This may be performed using a specialized scanning electron microscope system called a CD-SEM. In some embodiments, the critical dimension is measured in a plurality of locations on the workpiece. After the measuring is completed, a corrective process may be initiated.

The corrective process may comprise implanting ions into the photoresist. Implanting ions into photoresist may alter the size of the implanted photoresist. For example, in one embodiment, the implanted ions impart energy to the photoresist, which may cause outgassing and the densification of the implanted photoresist. Thus, in this embodiment, the implanted photoresist decreases in size. For example, implant species such as Ar or Si at energies of 1-3 keV could be used. In another embodiment, the implanted ions are used to harden the outer surface of the photoresist. Subsequent implanted ions may cause the interior of the photoresist to swell due to the addition of material and energy. Since the outer surface has been hardened, outgassing may not occur, causing the implanted photoresist to expand in size. For example, a simultaneous implantation of Ar or Si along with a lighter species such as H could be used.

The corrective process may comprise creating an ion implant spatial pattern across the workpiece which defines the ion dose and type of ions that are to be implanted into different areas of the workpiece. Various mechanisms may be used to perform the desired implant. For example, in some embodiments, a spot ion beam may be used, which is used relative to the workpiece. In this way, each portion of the workpiece may be exposed to the spot ion beam for an amount of time which has been predetermined based on the critical dimension measurement. Of course, other method of implanting a non-uniform dose of ions into the photoresist may also be used.

After the corrective process is completed, the workpiece may be processed in the traditional manner. For example, the workpiece may be subjected to an etching process, which removes material from the workpiece in areas that are not covered by the photoresist. After this etching process is completed, the photoresist is stripped from the workpiece, and additional processes may be performed.

FIG. 1 is a flow chart showing the sequence of processes used in a first embodiment. As stated earlier, the sequence begins by applying a photoresist to the workpiece, as shown in spin process 100. The photoresist is then exposed to light during the exposure process 110. After exposure, the photoresist is developed in the develop process 120. After the develop process 120, the workpiece is covered with photoresist having the desired lithography pattern repeated many times across the workpiece. The photoresist on the workpiece is then measured in photoresist measurement process 130. Specifically, the dimension of the widths of photoresist features is measured at a plurality of locations. In some embodiments, the dimension of the width of the photoresist features are measured at every location that it is repeated across the workpiece.

Based on the measured critical dimensions of the photoresist features, an ion implant pattern is determined in the calculation process 140. This ion implant process is intended to reduce the width of the photoresist in those regions where it is measured as being too thick. Alternatively or additionally, the ion implant process may increase the width of the photoresist in those regions where it is measured as being too thin. As described above, the dose, energy and type of ions applied to each portion of the photoresist may vary and is selected so as to improve the variability of the critical dimension of the photoresist.

This ion implant pattern is then applied to the workpiece in the corrective process 150. As described above, this may be done in a plurality of ways. The result of the corrective process 150 is a reduction in the variation of the critical dimension of the photoresist across the workpiece.

After the corrective process 150 has been completed, the workpiece undergoes further processing. First, material is removed from the workpiece from locations where there is no photoresist in etch process 160. While FIG. 1 and the subsequent figures refer to an etch process 160, it is understood that other type of fabrication processes may be performed at this time. Lastly, the remaining photoresist is stripped from the workpiece in the removal process 170.

The sequence of FIG. 1 is used to create a lithography pattern in the photoresist having improved variability of the critical dimension. Specifically, this sequence attempts to create a more uniform photoresist critical dimension distribution across the entirety of the workpiece through the use of a corrective process 150 using variable ion implantation.

Figure 6:
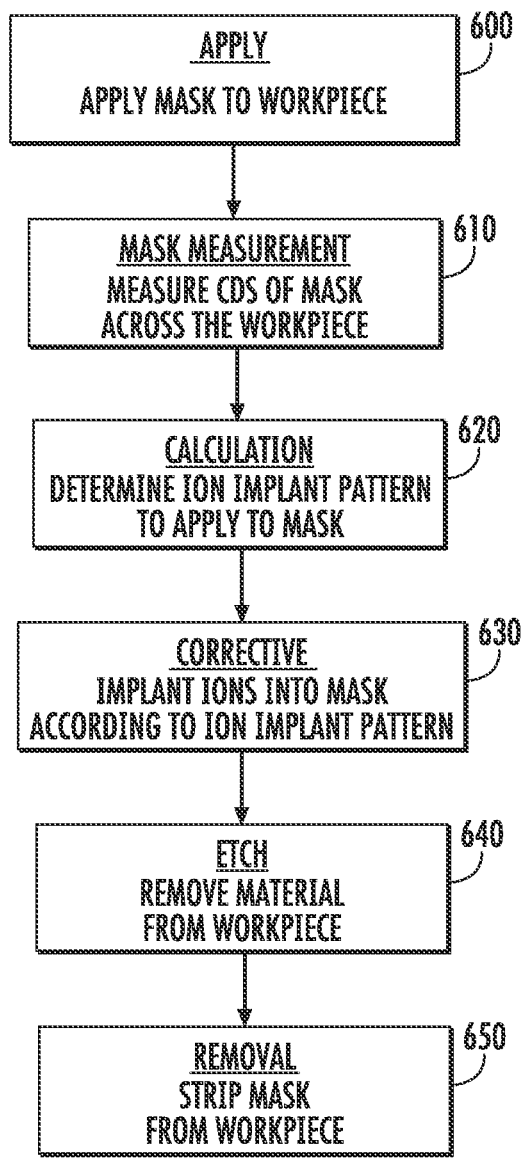
FIG. 6 is another sequence to improve the variability of the critical dimension of a workpiece.

While FIG. 1 illustrates a method that is based on the use of photoresist, other embodiments are also possible. FIG. 6 shows another embodiment, where the patterned mask may be any suitable material, including but not limited to photoresist.

First, the patterned mask is applied to the workpiece, as shown in apply process 600. As stated above, this patterned mask may be photoresist, but may also be other suitable types of masking material. Subsequently, the critical dimensions of the patterned mask are measured across the workpiece, as shown in mask measurement process 610. Based on the measured critical dimensions of the patterned mask, an ion implant pattern is determined in the calculation process 620. This ion implant process is intended to reduce the width of the patterned mask in those regions where it is measured as being too thick. Alternatively or additionally, the ion implant process may increase the width of the patterned mask in those regions where it is measured as being too thin. As described above, the dose, energy and type of ions applied to each portion of the patterned mask may vary and is selected so as to improve the variability of the critical dimension of the patterned mask.

This ion implant pattern is then applied to the workpiece in the corrective process 630. As described above, this may be done in a plurality of ways. The result of the corrective process 630 is a reduction in the variation of the critical dimension of the patterned mask across the workpiece.

After the corrective process 630 has been completed, the workpiece undergoes further processing. First, material is removed from the workpiece from locations where there is no mask in etch process 640. While FIG. 6 and the other figures refer to an etch process 640, it is understood that other type of fabrication processes may be performed at this time. Lastly, the patterned mask is stripped from the workpiece in the removal process 650.

Figure 2:
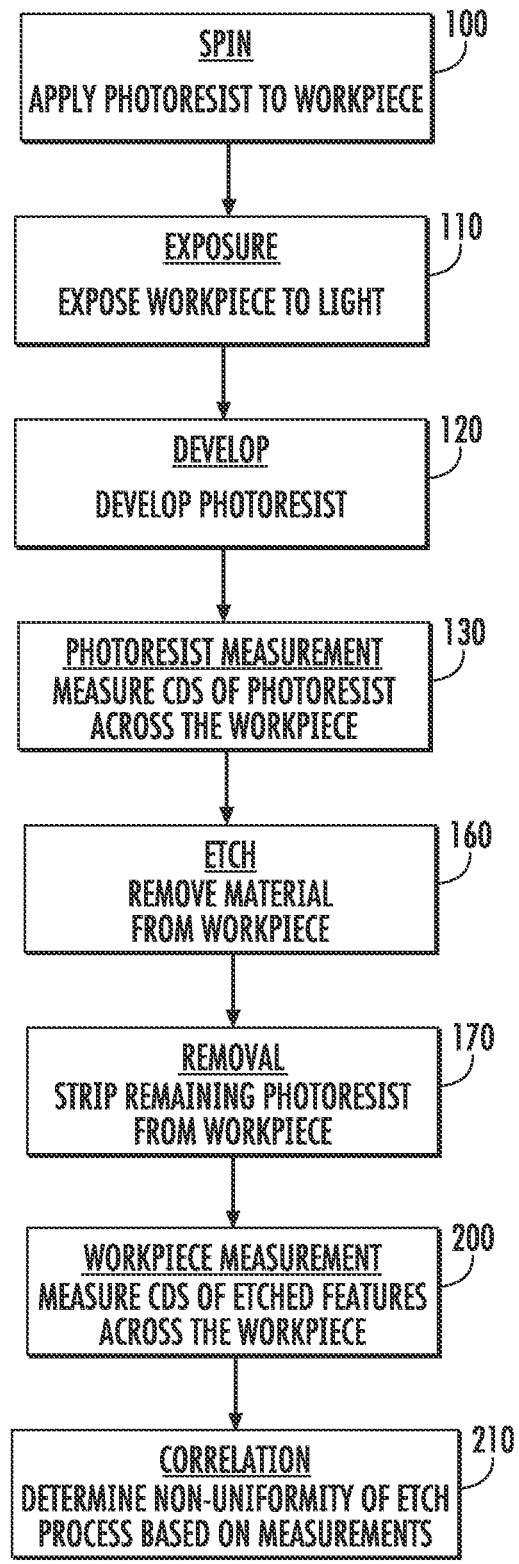
FIG. 2 is a sequence to determine a correlation between photoresist CD and workpiece CD.
Figure 3:
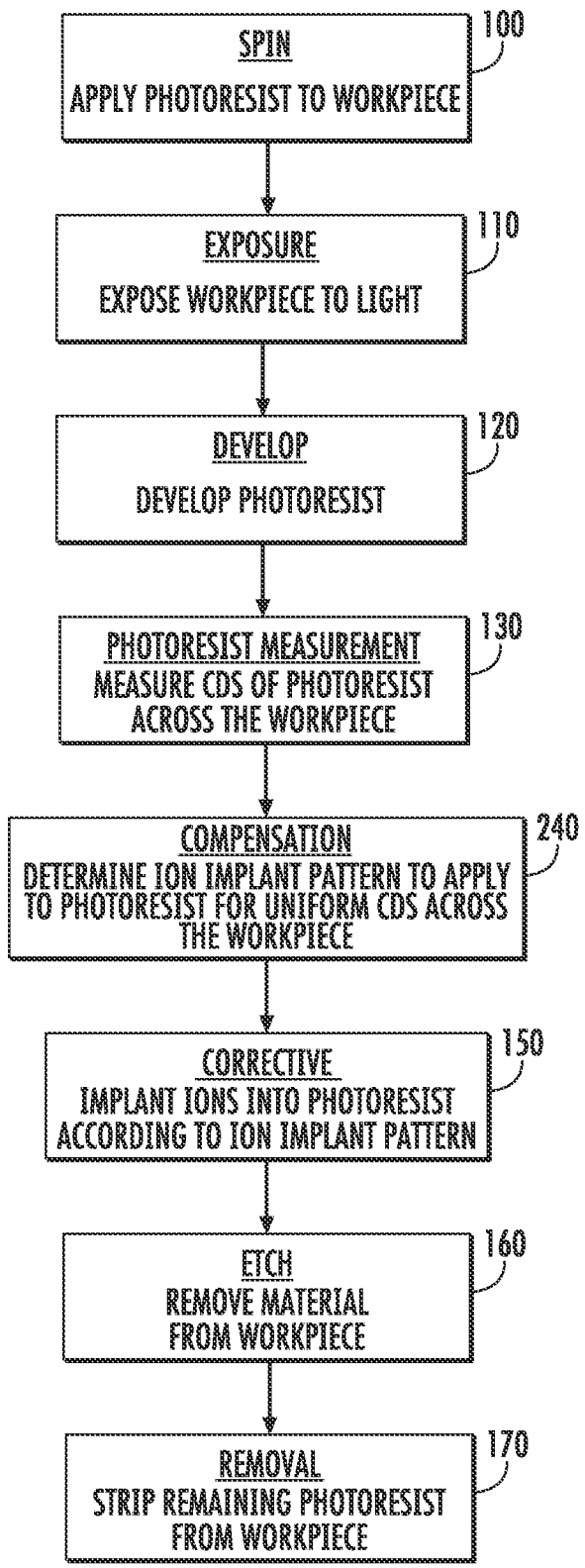
FIG. 3 is a second sequence to improve the variability of the critical dimension of a workpiece.

FIGS. 2 and 3 show a second embodiment, which takes into account any critical dimension non-uniformity due to the etch process. In this case, reducing variation in the critical dimension of the photoresist may not be sufficient to achieve the desired variability in the critical dimension of the etched workpiece. Although these figures show the process associated with photoresist, it should be understood that these techniques are applicable to any patterned mask.

FIG. 2 shows a flowchart which identifies the relationship or correlation between the measured critical dimension of the photoresist and the measured critical dimension of the subsequently etched feature in the workpiece. Similar processes are labeled using the same reference designators. As described in FIG. 1, the workpiece may experience a spin process 100, an exposure process 110, a develop process 120 and a photoresist measurement process 130. In this embodiment, after the photoresist measurement process 130 is completed, the etch process 160 is performed, followed by the removal process 170.

After the removal process 170, the critical dimension of the etched features in the workpiece is measured as shown in workpiece measurement process 200. This workpiece measurement process 200 may be performed using a specialized scanning electron microscope system called a CD-SEM to determine the width of the etched lines and spaces or other features in the workpiece. A correlation process 210 is then performed. This correlation process 210 compares the critical dimension of the photoresist, as determined in photoresist measurement process 130, to the critical dimension of that same etched feature in the workpiece, as determined in workpiece measurement process 200. This correlation process 210 determines the non-uniformity that is introduced by etch process 160. Thus, the correlation process 210 may create a compensation map. A compensation map relates measured photoresist critical dimension to measured etched feature critical dimension as a function of location on the workpiece. The sequence of FIG. 2 may be performed on a plurality of workpieces to improve the accuracy of the compensation map.

For example, based on the measurements taken in photoresist measurement process 130 and workpiece measurement process 200, it may be determined that, during etch process 160, more material is etched near the center of the workpiece than from near the edges. Thus, a uniform distribution of photoresist feature critical dimensions may yield a workpiece where the critical dimensions of the etched lines near the center of the workpiece are greater than the critical dimensions of the etched lines near the edge of the workpiece. In such a scenario, it may be desirable to reduce the critical dimension of the photoresist lines near the center of the workpiece to compensate for this subsequent non-uniformity in the etch process 160. While the above example highlights the etch process 160 as being non-uniform, the same applies to any subsequent process.

Once the non-uniformity of the subsequent processes has been characterized, the photoresist of future workpieces can be subjected to a corrective process to compensate for this non-uniformity assuming these subsequent process non-uniformities are consistent. Specifically, the compensation map describes a relationship between the photoresist, the etched features and the location on the workpiece. For example, FIG. 3 shows a sequence that can be used to perform a corrective process on a workpiece, which compensates for non-uniformities due to subsequent processes. Again, the workpiece is subjected to spin process 100, exposure process 110, develop process 120 and photoresist measurement process 130. The results of the photoresist measurement process 130 are used in conjunction with the compensation map determined in the correlation process 220 (see FIG. 2) to determine the desired ion implant pattern in the compensation process 240. The desired ion implant pattern is then applied to the photoresist in corrective process 150.

In another embodiment, the compensation process 240 determines the desired implant pattern based exclusively on the measurements of critical dimensions performed on other workpiece.

The corrective process 150 implants ions into the photoresist in a manner such that the critical dimension of the etched features in the processed workpiece is improved. As such, the ion implant pattern may intentionally create a photoresist pattern which is not uniform in terms of its critical dimension. As stated earlier, this is done so as to compensate for critical dimension distribution non-uniformities due to other downstream processes.

After the ions have been implanted in the corrective process 150, the workpiece is then subjected to an etch process 160. The remaining photoresist is then removed in the removal process 170.

By using empirical data gathered in FIG. 2, the corrective process 150 may implant ions so as to improve the variability of the critical dimension of the etched lines or other features across the workpiece. This is done by altering the critical dimension of the photoresist using ion implantation.

Thus, FIG. 1 and FIG. 3 show sequences which can be used to improve the variability of the critical dimension of an etched line or other feature in a workpiece. In these sequences, the corrective process 150 is performed to affect the critical dimension of the photoresist feature. In the embodiment of FIG. 1, the corrective process 150 is used to make the photoresist critical dimensions across the workpiece more uniform. In the embodiment of FIG. 3, the corrective process 150 is used to make the distribution of critical dimensions of the etched features across the workpiece more uniform, possibly at the expense of variability of the critical dimension of the photoresist features.

The embodiments of FIGS. 1-3 perform a "selective area" ion implant into the photoresist to improve the variability of critical dimensions. However, other embodiments are also possible. For example, rather than implanting ions into the photoresist, the ions may be implanted directly into the workpiece. In one embodiment, the implanted ions may change the optical properties of the underlying workpiece, such that the exposure and develop processes are altered. In another embodiment, the implanted ions may alter the resistance of the workpiece to the etching process.

The ions are implanted in accordance with an ion implant map which may be determined based on empirical data, generated from other similarly processed workpieces. For example, empirical data may indicate that certain portions of the workpiece typically have a larger critical dimension than other portions. Thus, ions may be implanted into those certain regions in order to affect the processing and reduce critical dimensions at those regions. Although FIGS. 4 and 5 show the process associated with photoresist, it should be understood that these techniques are equally applicable to any patterned mask.

Figure 4:
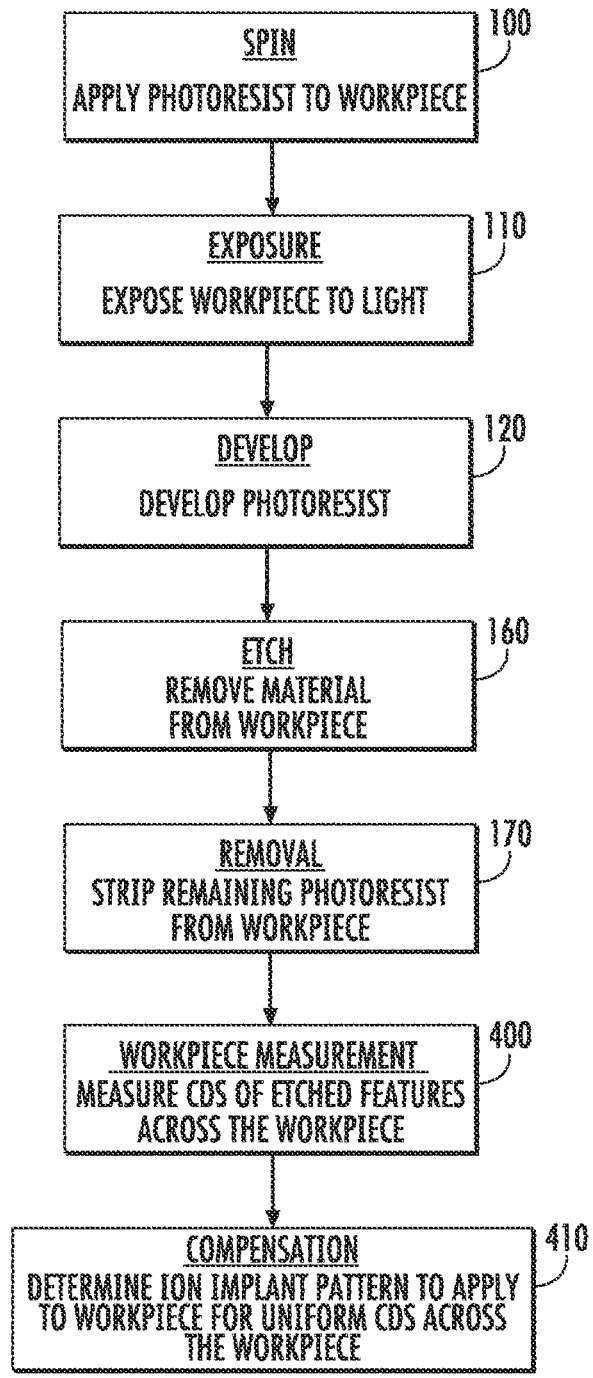
FIG. 4 is a sequence to determine empirically the critical dimension of a processed workpiece.

FIG. 4 shows a sequence that may be used to determine the appropriate ion implant pattern for this embodiment. As seen in FIG. 4, one or more workpieces may be subjected to the spin process 100, the exposure process 110, the develop process 120, the etch process 160, and the removal process 170. After the workpieces are processed, the critical dimensions of the etched features are measured across the workpiece in the workpiece measurement process 400. The results of the workpiece measurement process 400 may be used in compensation process 410 to determine the ion implant pattern to apply to the workpiece to achieve a more uniform critical dimension distribution across the workpiece.

Figure 5:
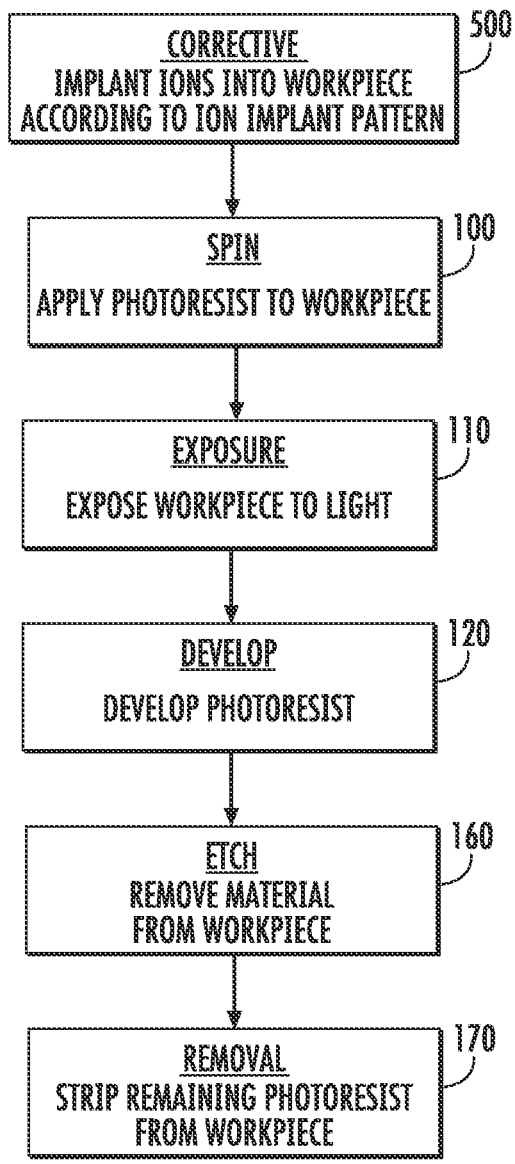
FIG. 5 is a third sequence to improve the variability of the critical dimension of a workpiece.

FIG. 5 shows a sequence that implants ions directly into the workpiece. In this sequence, a corrective process 500 is performed on the workpiece prior to the spin process 100. During the corrective process 500, ions are implanted directly into the workpiece so as to alter one or more of the subsequent processes. As stated above, in some embodiments, the implanted ions affect the creation of the lithography pattern on the photoresist. In other embodiments, the implanted ions affect the etch process 160. The ion implant pattern may be determined based on the workpiece measurement process 400 and compensation process 410 (see FIG. 4) performed on other workpieces.

The corrective process 500 alters at least one property of the underlying workpiece, so as to affect the critical dimension of the subsequently etched features of that workpiece. After the corrective process 500 has been performed, the spin process 100, exposure process 110, develop process 120, etch process 160 and removal process 170 may be performed on the workpiece. Because the corrective process 500 was performed prior to these processes, the resulting variability of the critical dimension of the etched workpiece is improved as compared to a workpiece which was not subjected to the corrective process 500.

The embodiments described in the present disclosure have many advantages. As described above, as feature sizes continue to decrease, reduction of the variability of the critical dimension become increasingly beneficial. The present embodiments disclose various methods that can be used to improve the variability of the CD. In certain embodiments, the feature width of the patterned mask is measured at a plurality of locations and then processed so as to reduce the variability of these measurements. This technique may therefore improve the inherent precision and accuracy of the lithography process. Further, in certain embodiments, the methods actually comprehend non-uniformities that occur downstream. In other words, in certain embodiments, the sizes of the features on the photoresist are modified based on empirical data that shows the correlation between photoresist feature width and the CD of the etched workpiece. Thus, this technique helps improve the inherent precision and accuracy of the lithography and etching processes. Further, these methods utilize ion implantation to reduce the variability of the critical dimension. In many deployments, ion implantation equipment is already available; thus these methods can be easily integrated into existing fabrication systems.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of processing a workpiece, comprising:
    applying a patterned mask to the workpiece;
    implanting ions into the patterned mask, where the ions are implanted based on an ion implant pattern, where the ion implant pattern defines a dose of ions to implant as a function of location on the workpiece and is calculated to reduce variability of a critical dimension of the workpiece; and
    processing the workpiece after the implanting, wherein the ions are selected from the group consisting of silicon and argon
    wherein the ion implant pattern is determined based on critical dimensions of the patterned mask measured at the plurality of locations and a compensation map, wherein the compensation map is determined empirically based on critical dimensions of a patterned mask of a second workpiece measured at a plurality of locations and measured critical dimensions of etched features of the second workpiece at the plurality of locations.

2. The method of claim 1, wherein the ion implant pattern is calculated based on measurements of critical dimensions of etched features performed on other workpieces.

3. The method of claim 1, wherein the patterned mask comprises photoresist.

4. The method of claim 1, wherein the processing comprises etching the workpiece.

5. A method of processing a workpiece, comprising:
    applying a patterned mask to a surface of the workpiece;
    measuring a critical dimension of a mask feature of the patterned mask at a plurality of locations on the workpiece;
    creating an ion implant pattern, which defines a dose of ions to implant as a function of location on the workpiece, based on the critical dimension of the mask feature measured at the plurality of locations;
    implanting ions into the patterned mask based on the ion implant pattern;
    etching the workpiece after the implanting; and
    removing the patterned mask after the etching, wherein the ions are selected from the group consisting of silicon and argon wherein the ion implant pattern is determined based on the critical dimension of the patterned mask measured at the plurality of locations and a compensation map, wherein the compensation map is determined empirically based on critical dimensions of a patterned mask of a second workpiece measured at a plurality of locations and measured dimensions of etched features of the second workpiece at the plurality of locations.

6. The method of claim 5, wherein the compensation map is determined by:

measuring critical dimensions of a patterned mask of the second workpiece at a plurality of locations;

etching the second workpiece using the patterned mask to create etched features in the second workpiece; and measuring critical dimensions of the etched features of the second workpiece at the plurality of locations; and comparing the critical dimension of the patterned mask to the critical dimensions of the etched features at each of the plurality of locations to determine the compensation map.

7. The method of claim 5, wherein the ion implant pattern is determined to reduce variability of a critical dimension of the patterned mask at the plurality of locations.

8. The method of claim 5, wherein the ion implant pattern is determined to reduce variability of a critical dimension of etched features in the workpiece.

9. The method of claim 5, wherein the patterned mask comprises photoresist.

10. The method of claim 5, wherein the ions are implanted to decrease a size of the patterned mask.

11. The method of claim 5, wherein the ions are implanted to increase a size of the patterned mask.

12. The method of claim 11, wherein hydrogen ions are also implanted to increase the size of the patterned mask.

13. The method of claim 5, wherein the compensation map is determined by:

measuring critical dimensions of a patterned mask of the second workpiece at a plurality of locations;

etching the second workpiece using the patterned mask to create etched features in the second workpiece; and measuring critical dimensions of the etched features of the second workpiece at the plurality of locations; and comparing the critical dimension of the patterned mask to the critical dimensions of the etched features at each of the plurality of locations to determine the compensation map.

* * * * *